United States Patent [19]

Yasuda et al.

[11] Patent Number: 4,789,786

[45] Date of Patent: Dec. 6, 1988

[54] METHOD OF PROJECTING PHOTOELECTRON IMAGE

[75] Inventors: Hiroshi Yasuda, Yokohama; Ichiro Honjo, Ibaragi, both of Japan

[73] Assignee: Fujitsu Limited, Kawasaki, Japan

[21] Appl. No.: 144,275

[22] Filed: Jan. 15, 1988

Related U.S. Application Data

[63] Continuation of Ser. No. 799,321, Nov. 18, 1985, abandoned.

[30] Foreign Application Priority Data

Nov. 20, 1984 [JP] Japan ................ 59-243342
Nov. 20, 1984 [JP] Japan ................ 59-243343
Nov. 29, 1984 [JP] Japan ................ 59-252151

[51] Int. Cl.$^4$ .................. H01L 21/30; G03F 7/27
[52] U.S. Cl. .................. 250/492.2; 250/492.3
[58] Field of Search ............ 250/492.2, 492.1, 492.3, 250/492.22, 492.24

[56] References Cited

U.S. PATENT DOCUMENTS

| 3,679,497 | 7/1972 | Handy et al. | 250/492.1 |
| 3,710,101 | 1/1973 | O'Keeffe et al. | 250/492.2 |
| 3,832,560 | 8/1974 | O'Keeffe | 250/492.2 |
| 3,843,916 | 10/1974 | Trotel et al. | 250/492.2 |
| 4,137,458 | 1/1979 | King et al. | 250/492.2 |
| 4,467,210 | 8/1984 | Sugihara et al. | 250/492.2 |
| 4,572,956 | 2/1986 | Tojo et al. | 250/492.2 |

FOREIGN PATENT DOCUMENTS

| 2700573 | 7/1978 | Fed. Rep. of Germany ... 250/492.2 |
| 57-194531 | 11/1982 | Japan . |
| 58-7053 | 2/1983 | Japan . |
| 0066816 | 4/1985 | Japan .................. 250/492.2 |

Primary Examiner—Bruce C. Anderson
Assistant Examiner—Paul A. Guss
Attorney, Agent, or Firm—Staas & Halsey

[57] ABSTRACT

A method for projecting a photoelectron image includes providing a mask substrate, and selectively contacting a layer which lowers the work function of the mask substrate thereto. Photoelectrons are emitted from the contacted portion.

6 Claims, 8 Drawing Sheets

METHOD OF PROJECTING PHOTOELECTRON IMAGE

This is a continuation of co-pending application Ser. No. 799,321 filed on Nov. 18, 1985, abandoned.

BACKGROUND OF THE INVENTION

1. Field of the Invention

The present invention relates to a method for projecting a photoelectron image, more particularly, to a method for projecting a photoelectron image using a mask having a photoelectrically active surface.

2. Description of the Related Art

Photolithography is an important technique in the production of, for example, VLSI. Among the photolithography techniques, there are techniques of projecting fine patterning to wafers or the like. One of these is the "Direct-Stepping-on Wafer" (DSW) process, wherein a scaled down, e.g. 5:1 or 10:1, projection exposure process using light (having a wavelength of about 4000 Å) is carried out using a reticle as an original print. However, the DSW process has a resolution limit of about 1 μm.

In order to improve resolution, the electron beam exposure process and X-ray exposure process are well known.

In the electron beam exposure process, the electron beam is scanned with a point or a rectangular shape, thereby increasing the exposure time. The electron beam exposure process therefore has a small throughput.

The X-ray exposure process uses an X-ray having a wavelength of 1 to 10 Å and a large-scale light source of, for example, 10 to 50 kW whereby proximity exposure is carried out. Thus, the X-ray exposure process requires a highly accurate aligner to support and align the mask and wafer. On this point, the X-ray exposure is similar to conventional optical exposure.

However, there are problems in that the X-ray exposure process requires high cost due to the large scale of the light source and considerations of mask materials in relationship with the absorption coefficient and wavelength of light source. Also, blurring occurs due to changes in the gap between the mask and wafer generated by wrapping of the wafers. One light source used for generating the X-ray is a sychrotron emittion light which is too large in scale and high in cost.

Recently, the ion beam exposure process has been studied. However, ion beam exposure has the same problems as electron beam exposure.

In an electron beam projecting process similar to the present invention, a mask image is projected to a portion to be patterned. The mask is produced by a process comprising the steps of providing a pattern to be projected made of an ultraviolet absorber, such as Cr, on, for example, crystal glass and covering the same with photoelectric material, such as CsI, from which electrons are emitted by irradiation with ultraviolet light. When ultraviolet light is irradiated from the back surface of the photoelectric material through the crystal glass (back illumination), photoelectrons are emitted only from the portion of the photoelectric material on the crystal glass, not from the portion of the photoelectric material on the ultraviolet absorber. The emitted electrons are focused on an electron sensitive resist provided on a wafer, while a magnetic field is applied therebetween.

However, the resist for the electron beam on the wafer is sometimes sensitized by the ultraviolet light, (particularly when it has a large energy) passed through the mask, as well as by the emitted electrons. This prevents accurate projections of the pattern of the mask, resulting in blurring of the image. Further, electrons of CsI are emitted as a result of ultraviolet light using a low pressure (5 mW) Hg lamp. Thus, the exposure period for 20 mm □ using the ultraviolet light is low, for example, 30 sec.

SUMMARY OF THE INVENTION

It is an object of the present invention to provide a method for projecting a photoelectron image wherein an improved resolution of optical exposure can be obtained.

It is another object of the present invention to provide a method for projecting a photoelectron image wherein an improved mask is used to obtain a large throughput.

It is a further object of the present invention to provide a method for projecting a photoelectron image wherein visible light can be used.

According to the present invention, there is provided a method for projecting a photoelectron image comprising the steps of: providing a mask substrate; selectively contacting a layer which lowers the work function of the mask substrate thereto, and emitting photoelectrons from the contacted portion.

Further, according to the present invention, there is provided a method for projecting a photoelectron image comprising the steps of: providing a mask substrate; forming a patterned metal layer on the mask substrate in vacuum; irradiating the exposed mask substrate and the metal layer with light in vacuum while applying an electric field and a magnetic field; and projecting the photoelectron image formed by photoelectrons emitted from the light irradiated portion.

DESCRIPTION OF THE PREFERRED EMBODIMENTS

Before describing the preferred embodiments of the present invention, a conventional method for projecting a photoelectron image will be explained in detail.

Figure 1:
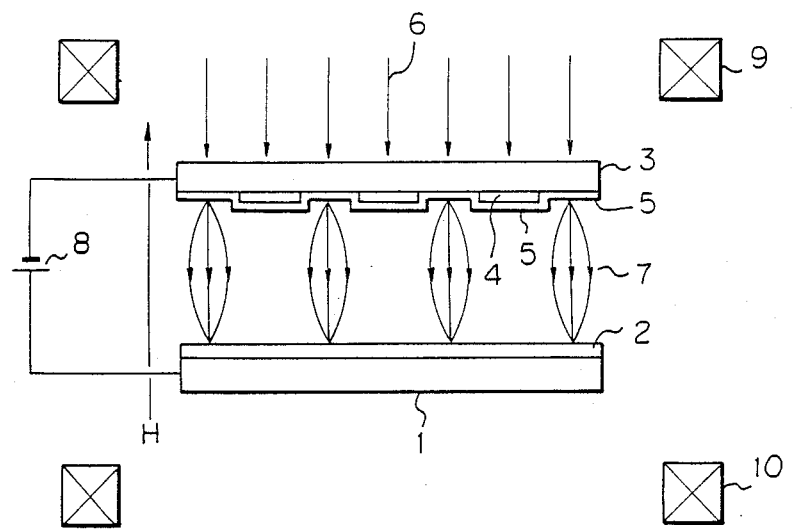
FIG. 1 is a diagram for explaining a conventional method for projecting a photoelectron image.

FIG. 1 is a diagram for explaining a conventional method for projecting a photoelectron image. As shown in FIG. 1, a semiconductor wafer 1 has formed thereon an electron-sensitive resist layer 2. A transparent mask substrate 3 such as quartz has formed thereon a patterned Cr layer 4. On the surface of the obtained mask, a layer from which photoelectrons are emitted, for example a Pd (having a thickness of about 40 Å) or CsI (having a thickness of about 500 Å) layer is formed. Between the obtained mask and the semiconductor wafer, a uniform magnetic field H is applied and a bias is applied by an electric source 8, so that the mask side is minus and the wafer side is plus. Reference numerals 9 and 10 denote Helmholtz coils.

In FIG. 1, the mask substrate 3 is irradiated with ultraviolet light 6 from the back side (back illumination) of the layer 5 from which the photoelectrons are emitted (hereinafter referred to as the photoelectron layer). In the Cr layer 4, Cr absorbs the ultraviolet light preventing it from reaching the layer 5. On the other hand, on the portion of the mask in which no Cr layer is formed, the ultraviolet light reaches the photoelectron layer 5, and photoelectrons 7 are emitted therefrom, having a kinetic energy obtained by subtracting the work function $\phi$ of the photoelectron emitted substance from the light energy $h\gamma$. The thus emitted photoelectrons are focused on the surface of the wafer 1 by the magnetic field H and the bias obtained by an electric source 8.

In the back illumination process using ultraviolet light the ultraviolet light passes through the mask layer, i.e., Cr layer 4, and reaches the wafer 1, whereby the electron-sensitive resist 2 senses the ultraviolet light and a correct or accurate projecting process is not possible.

CsI, used as the photoelectron layer 5, does not emit photoelectrons if it is not irradiated with light having a short wavelength of 1849 Å; 6.7 eV (ultraviolet area in vacuum). In the case of a short wavelength light, no suitable light source has been found and no suitable lens has been obtained.

Figure 2:
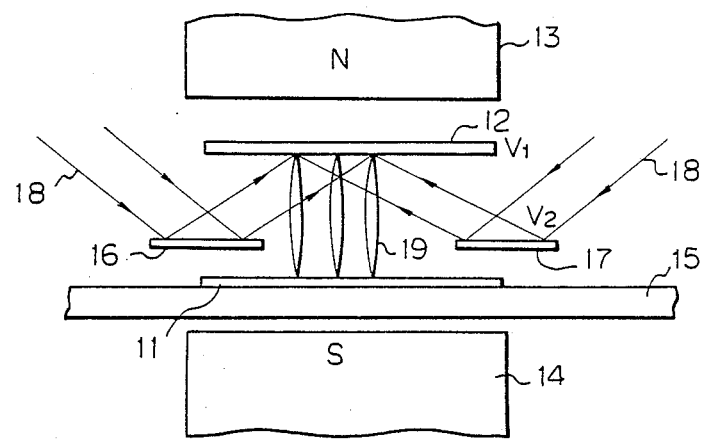
FIG. 2 is a diagram for explaining the principle of the present invention.

FIG. 2 is a diagram for explaining the principle of the present invention. As shown in FIG. 2, a uniform electric field is applied between an N pole 13 and an S pole 14 of a magnet. A wafer 11 and a mask 12 are oppositely disposed therebetween. The wafer 11 is provided on a stage 15. Between the wafer 11 and mask 12, reflectors 16 and 17 are disposed. Ultraviolet or visible light 18 is reflected by the reflectors to irradiate a photoelectron layer surface of the mask 12. Photoelectrons 19 emitted from the photoelectron layer surface are focused at the surface of the wafer 11. According to the present invention, the wafer can be exposed by the step-and-repeat system, for example, 10 to 300 mm □.

Figure 3:
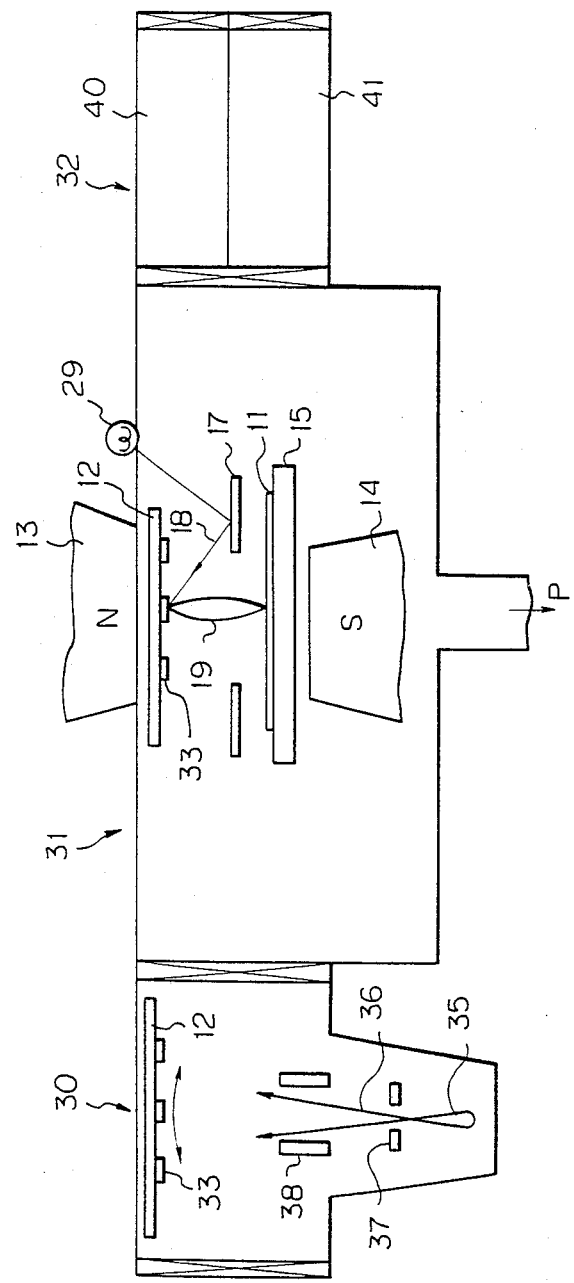
FIG. 3 is a side view of an embodiment of the present invention.

FIG. 3 is a side view of an embodiment of the present invention.

A Pt layer 33 (having a thickness of 500 Å) is formed on a GaAs mask substrate 12 by a vacuum evaporation process, and the Pt layer 33 is patterned. The obtained mask substrate is provided in a vacuum chamber 30 which acts as a subchamber.

The exposed Pt layer 33 and GaAs substrate 12 are irradiated with an alkali metal beam, e.g., a Cs ion beam 36 generated from a Cs source 35 in a well-known ion beam generator, so that a Cs photoelectron-active layer is formed thereon. In FIG. 3, reference numerals 37 and 38 denote a leading electrode and an electro static polarization electrode. As an alternative to Cs, an alkaline earth metal such as Ba may be employed.

The thus obtained mask substrate is moved to the next vacuum chamber 31 which acts as a main chamber. A wafer 11 is provided so that it faces the Cs layer formed on the patterned PT layer 33 of the mask substrate.

Light 18 is illuminated from a light source 29 e.g., halogen lamp, and reflected by a mirror 17 so that the surface of the mask substrate is irradiated with the light 18, whereby the image formed by photoelectrons 19 emitted from the Cs layer is projected on the wafer 11. In this case a bias of about −80 KV is applied on the mask substrate side to emit the photoelectrons 19.

Further, in order to accurately focus the emitted photoelectrons on the wafer surface, a uniform magnetic field is applied so that the mask substrate side is the N pole 13 and the wafer side is the S pole 14. Near the second vacuum chamber 31, a third vacuum chamber 32 is provided. The third vacuum chamber 32 is separated into a chamber 40 for the mask substrate and a chamber 41 for the wafer.

Figure 4:
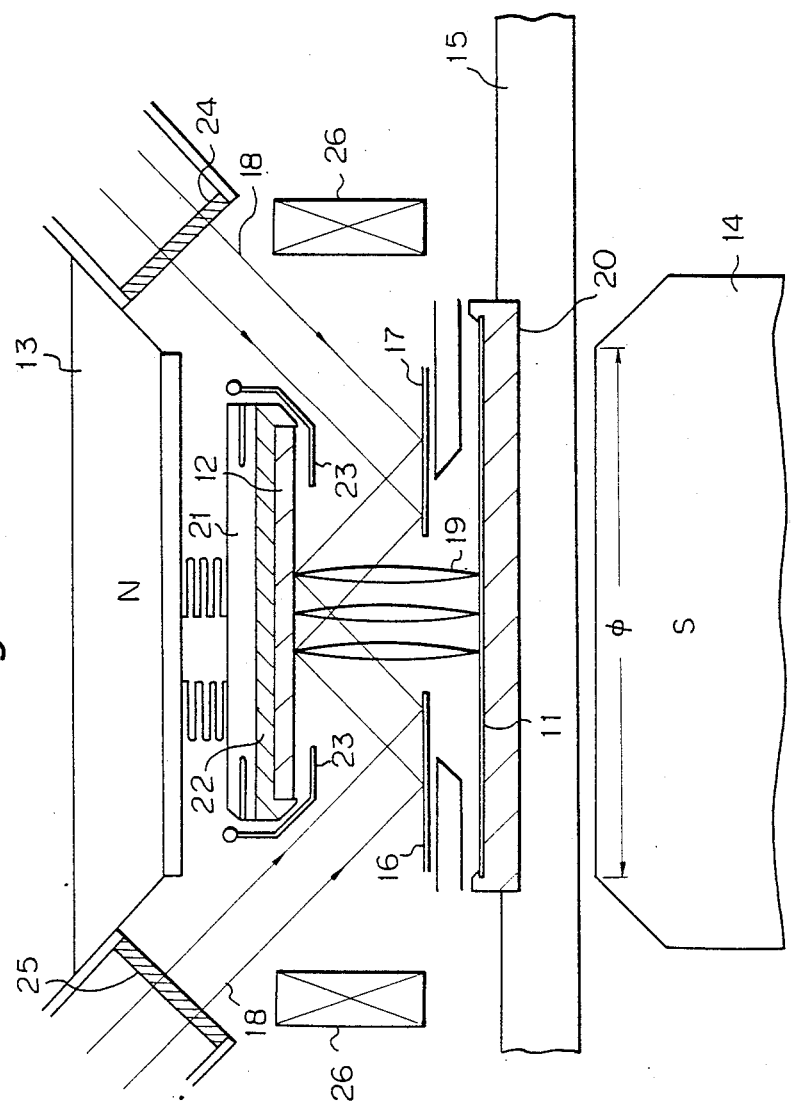
FIG. 4 is a side view of the second chamber of FIG. 3.

FIG. 4 is a 31 detailed side view of the second vacuum chamber of FIG. 3. As shown in FIG. 4 between the N pole 13 and S pole 14, a uniform magnetic field is formed. The mask 12 and wafer 11 are disposed so that the mask 12 faces the wafer 11. The wafer 11 is fixed by a wafer holder 20 with a chuck, the wafer holder 20 is rotated on a stage 15 which can be moved in the X and Y (namely, horizontal) directions. Visible light 18 passed through windows 24 and 25, is reflected by reflectors 16 and 17, and the photoelectron layer surface of the mask 12 is irradiated with the light 18. The emitted electrons 19 are focused on the surface of the wafer 11. The mask 12 is held by a mask holder 22, which is insulatedly supported by a ceramic material 21. A magnetic field for the focus of the electrons is obtained by the poles 13 and 14 (having a cross section of about 40 mm $\phi$). Within the ends of the poles 13 and 15, a uniform magnetic field can be formed.

Figure 5:
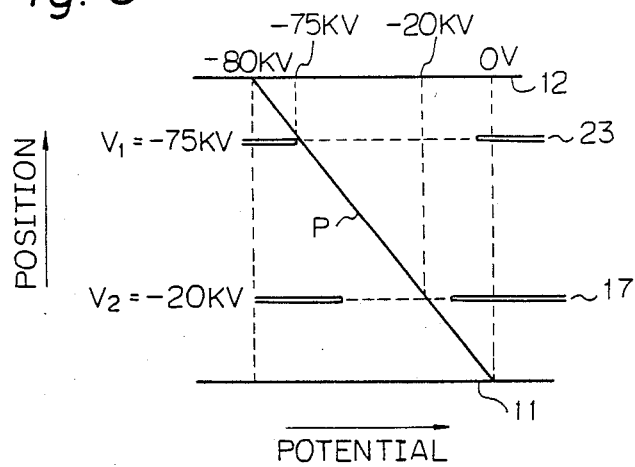
FIG. 5 is a diagram for explaining a construction to obtain a uniform electric field.

On the other hand, a uniform electrical field is required. For example, a bias of −80 KV is applied on the mask 12 and a bias of OV is applied on the wafer 11. In this case, as shown in FIG. 5, when a bias of a valves $V_1$ and $V_2$ are applied on an electrode plate 23 and a reflector 17, so that a potential P is linearly changed, the electric field can be unified.

Figure 6:
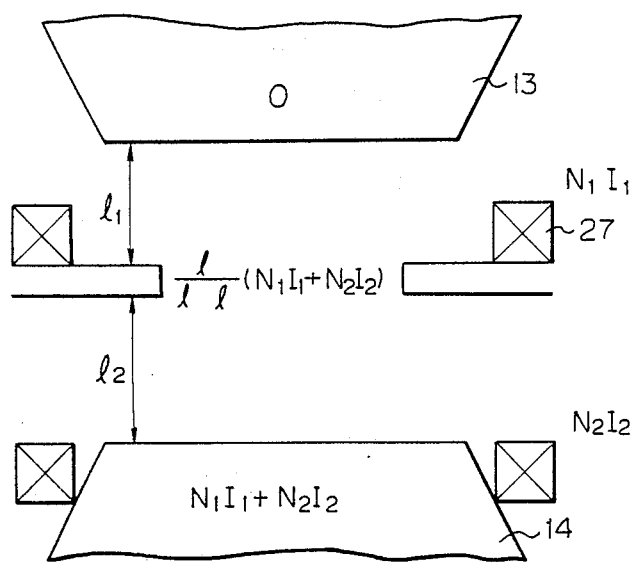
FIG. 6 is a diagram for explaining how to obtain a uniform magnetic field.

In order to obtain a more uniform magnetic field, a compensator may be used, as shown in FIG. 6. In FIG. 6, when the magnetic potential of the N pole 13 is O and the magnetic potential of the S pole 14 is $N_1I_1+N_2I_2$, if the compensating coil 27 is provided so that the expression $l_1/(l_1+l_2)(N_1I_1+N_2I_2)=N_1I_1$ is satisfied, the potential of the surface near the compensating coil 27 can be linearly oriented. In the above expression, $l_1$ and $l_2$ are the distances between the compensating coils and magnetic poles 13 and 14, respectively. $N_1I_1$ and $N_2I_2$ mean ampere turns.

Figure 7:
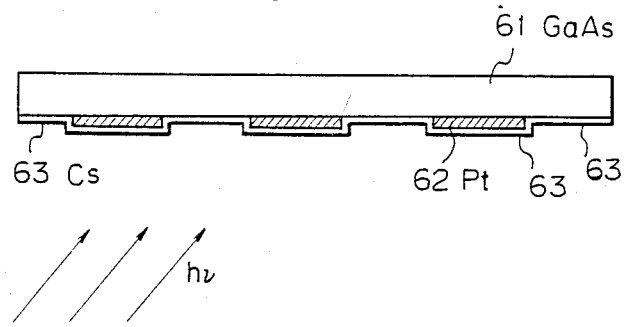
FIGS. 7 and 8 are cross-sectional views for explaining masks according to the present invention.
Figure 8:
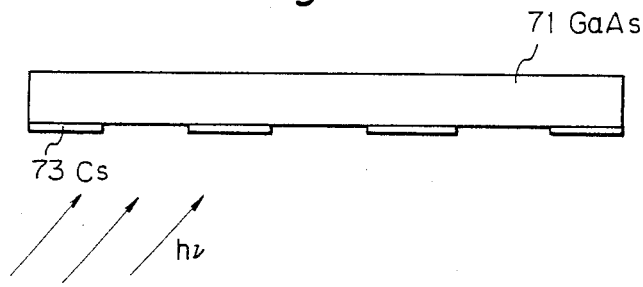

FIGS. 7 and 8 show embodiments of masks according to the present invention. As shown in FIG. 7, a GaAs mask substrate 61 has formed on it a patterned metal 62 such as Pt. Further, on the exposed surface, a photoelectron layer of alkali metal such as Cs is formed. Electrons start being emitted from the Cs layer by light having an energy of about 1.5 eV. The quantum efficiency becomes well enhanced with an energy of 2 to 3 eV. In the case of forming a Cs layer. Cs may be oxidated several times to form several Cs-O layers.

In FIG. 8, a patterned Cs layer 73 is formed on a GaAs mask substrate 71. When light is illuminated, photoelectrons are also emitted from the patterned Cs layer 73.

Figure 9:
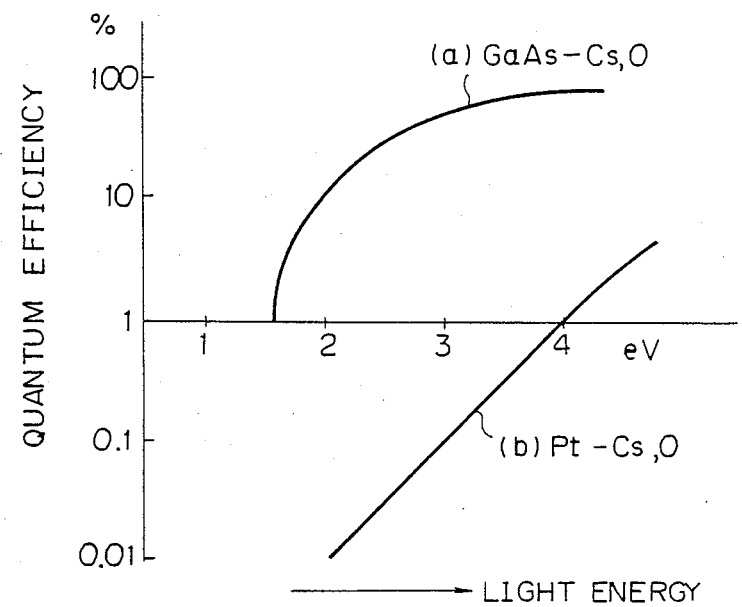
FIG. 9 is a graph of the relationship between irradiated light energy and quantum efficiency.

FIG. 9 is a graph of the relationship between quantum efficiency and irradiating light energy. In FIG. 9, (a) and (b) are the relationships in the cases where GaAs and Pt are respectively used as base mask layers. As shown in FIG. 9, the quantum efficiency is higher in the case of (a) than in the case of (b).

Figure 10:
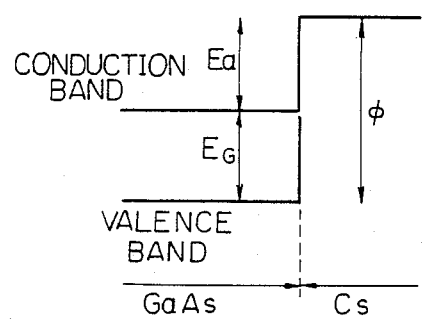
FIG. 10 is an energy diagram for GaAs-Cs.

FIG. 10 is an energy diagram of GaAs-Cs. In FIG. 10, $E_G$, $E_a$ and $\phi$ are a band gap, electron affinity, and the work function, respectively. The larger $E_G/E_a$ becomes, the more the quantum efficiency is enhanced. In the case of GaAs-Cs, $E_G/E_a \geq 1$ and, thus, the quantum efficiency is high.

In the back illumination explained in the conventional process, a transparent mask has patterned on it a substrate material which absorbs light. Then, a photoelectron layer is formed on the entire surface as explained above. On the other hand in the present invention, a mask substrate has formed on it two kinds of areas having different quantum efficiencies, whereby the quantity of photoelectrons emitted from the areas are different. According to the present invention, Cs deposition or a Cs treatment process is carried out to form the areas as explained above. In the present invention, almost all photoelectron materials can be used, but Cs, Cs treated —Sb, —Te, —Ag$_2$O, etc are preferable as photoelectron layers. For example, the Cs treated —Sb layer is produced by forming a Sb layer on, for example, a sapphire substrate, and forming Cs layer on the Sb layer. In turn, areas wherein photoelectrons are not emitted are made of metal, for example, Pt, Cr, W, Mo, Ta, Au, and Ag. When a transparent GaP mask substrate and epitaxial GaAs thin layer (having a thickness of 1 μm) is used, the back illumination process can be also used.

Figure 11:
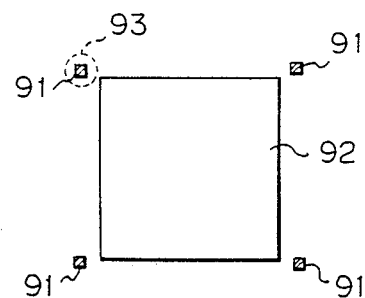
FIG. 11 is a diagram for explaining alignment of a mask with a wafer.

Alignment of a mask with a wafer will be explained with reference to FIG. 11. As shown in FIG. 11 a mark 91 for alignment is provided around a mask pattern 92. At least two marks 91 are needed so as to match rotation. When the mask is aligned with the wafer, light is shut off with shutters (in FIG. 4, windows 24 and 25 are closed), and another strong light 93 illuminates only the portions of the marks 91. Then using electrons emitted from the marks 91, the marks 91 are superposed on the marks of the wafer to align the mask with the wafer.

Figure 12:
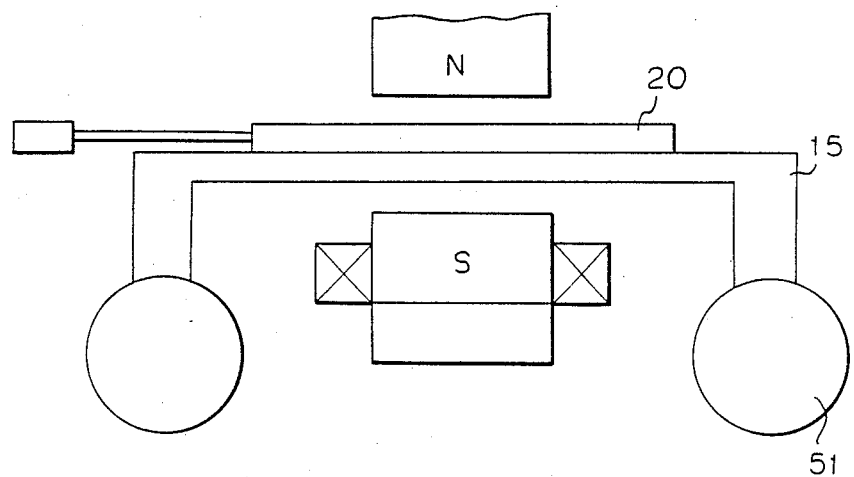
FIGS. 12 and 13 are diagrams of the constructions of stages used in the present invention.
Figure 13:
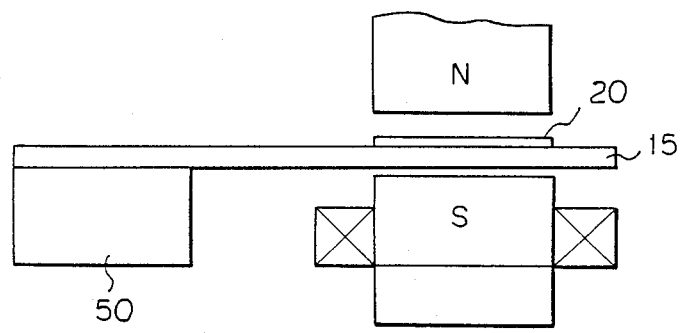

FIGS. 12 and 13 are side views of constructions of stages used in the present invention. As shown in FIG. 12, a stage 15 for alignment can be moved in the X- and Y-directions. A wafer holder 20 with a chuck (not shown) is rotatably moved. 51 denotes an axis of stage side forming an air bearing.

Further, as shown in FIG. 13, a moving mechanism 50 of a stage is provided at one side. Instead of the use of a stage, a (mark detection) scanner (MD) may be used for the alignment.

Figure 14:
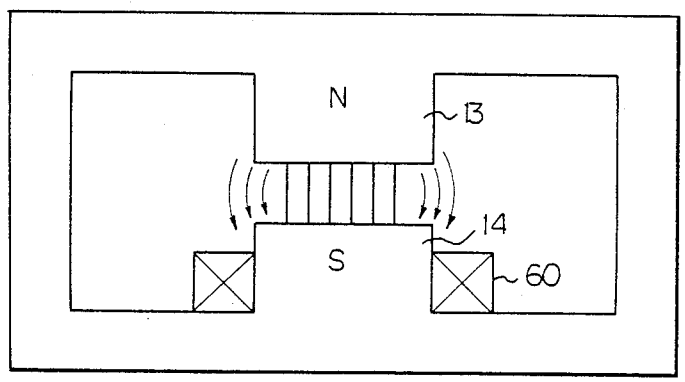
FIG. 14 is a diagram of the construction of a magnetic pole used in the present invention.

A magnetic pole of the present invention will be explained with reference to FIG. 14. As shown in FIG. 14, instead of the N and S poles 13 and 14, use is made of an electromagnet composed of a coil 60 through which current is passed.

We claim:

1. A method for projecting a photoelectron image comprising the steps of:
   (a) providing a mask substrate;
   (b) selectively forming a patterned layer on the mask substrate so as to define two types of areas including an exposed portion of the mask substrate;
   (c) forming a metal layer selected from the group consisting of Cs, Ba and Cs treated —Sb, —Te and —Ag$_2$O on the exposed portion of the mask substrate and the patterned layer in order to lower the work function of the two types of areas in a vacuum, the two types of areas having different quantum efficiencies;
   (d) irradiating the surface of the metal layer formed in said step (c) to cause photoelectrons to be emitted from one side therefrom, while applying an electric field and a magnetic field; and
   (e) projecting a photoelectron image based on the emitted photoelectrons.

2. A method according to claim 1, wherein the mask substrate is selected from the group consisting of GaAs, GaP, quartz, and sapphire.

3. A method according to claim 2, wherein the patterned metal is selected from the group consisting of Pt, Cr, W, Mo, Ta, Au, Ag, and Ti.

4. A method according to claim 1, wherein said step of irradiating with light is carried out from the photoelectron emitting side of the metal layer.

5. A method for projecting a photoelectron image comprising the steps of:
   (a) providing a mask substrate;
   (b) forming a patterned metal layer on the mask substrate so that an exposed portion of the mask substrate remains;
   (c) forming a photoelectron-active layer on the patterned metal layer and the exposed portion of the mask substrate so as to form first and second types of areas having first and second quantum efficiencies, the photoelectron-active layer selected from the group consisting of Cs, Ba and Cs treated —Sb, —Te and —Ag$_2$O;
   (d) irradiating the photoelectron-active layer with visible light so that a larger quantity of photoelectrons is emitted from the first type of area than from the second type of area; and
   (e) projecting a photoelectron image formed by photoelectrons emitted from the photoelectron-active layer.

6. A method according to claim 5, further comprising the step of applying an electric field and a magnetic field during said irradiating step (d) and performing said irradiating step (d) in a vacuum.

* * * * *